United States Patent
Zhang et al.

(10) Patent No.: US 10,229,634 B2
(45) Date of Patent: Mar. 12, 2019

(54) LEVEL SHIFTING UNIT, LEVEL SHIFTING CIRCUIT, METHOD FOR DRIVING THE LEVEL SHIFTING CIRCUIT, GATE DRIVING CIRCUIT AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Zhihao Zhang, Beijing (CN); Zhihua Sun, Beijing (CN); Weichao Ma, Beijing (CN); Xu Zhang, Beijing (CN); Guohuo Su, Beijing (CN); Jianming Wang, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/519,984

(22) PCT Filed: Aug. 19, 2016

(86) PCT No.: PCT/CN2016/095949
§ 371 (c)(1),
(2) Date: Apr. 18, 2017

(87) PCT Pub. No.: WO2017/118034
PCT Pub. Date: Jul. 13, 2017

(65) Prior Publication Data
US 2018/0301082 A1 Oct. 18, 2018

(30) Foreign Application Priority Data

Jan. 8, 2016 (CN) .......................... 2016 1 0013117

(51) Int. Cl.
*G09G 3/3225* (2016.01)
*G09G 3/36* (2006.01)
*H03K 19/017* (2006.01)

(52) U.S. Cl.
CPC ......... *G09G 3/3225* (2013.01); *G09G 3/3648* (2013.01); *H03K 19/017* (2013.01);
(Continued)

(58) Field of Classification Search
CPC ............... G09G 3/3225; G09G 3/3648; G09G 2310/0289; G09G 2320/0219; H03K 19/017
See application file for complete search history.

(56) References Cited

U.S. PATENT DOCUMENTS 6,087,852 A * 7/2000 Briggs ............. H03K 3/356113
326/63
6,404,230 B1 6/2002 Cairns et al.
(Continued)

FOREIGN PATENT DOCUMENTS

CN 1316827 A 10/2001
CN 102768825 A 11/2012
(Continued)

OTHER PUBLICATIONS

International Search Report and Written Opinion for Application No. PCT/CN2016/095949, dated Nov. 25, 2016, 13 Pages.

*Primary Examiner* — Amit Chatly
(74) *Attorney, Agent, or Firm* — Brooks Kushman P.C.

(57) ABSTRACT

The present disclosure provides a level shifting unit which includes, for example, a logic control module, an output module, an output control module and a feedback module. The logic control module is connected to a turn-on power supply, a driving power supply, an input signal terminal, and the output module. The feedback module is connected to an
(Continued)

enable signal terminal, a signal output terminal, and the output control module. The output control module is connected to the output module and the driving power supply. The output module is connected to the signal output terminal. The feedback module controls to turn on or turn off the output module through the signals outputted from the enable signal terminal and the signal output terminal. If the signals outputted by two level shifting units are short circuited, the feedback module controls the output control module of the level shifting circuit to be disconnected.

19 Claims, 2 Drawing Sheets

(52) U.S. Cl.
CPC ............... *G09G 2310/0289* (2013.01); *G09G 2320/0219* (2013.01)

(56) References Cited

U.S. PATENT DOCUMENTS

| | | | | |
|---|---|---|---|---|
| 2004/0150610 | A1* | 8/2004 | Zebedee | ............... G11C 19/28 |
| | | | | 345/100 |
| 2005/0088397 | A1* | 4/2005 | Yu | ....................... G09G 3/2096 |
| | | | | 345/100 |
| 2006/0158421 | A1* | 7/2006 | Masuko | ............... G09G 3/3688 |
| | | | | 345/100 |
| 2011/0309873 | A1* | 12/2011 | Miller | ............ H03K 19/018521 |
| | | | | 327/333 |
| 2012/0280966 | A1 | 11/2012 | Chen et al. | |

FOREIGN PATENT DOCUMENTS

| | | |
|---|---|---|
| CN | 104078966 A | 10/2014 |
| CN | 105632438 A | 6/2016 |
| JP | 2011181626 A | 9/2011 |

\* cited by examiner

Fig. 4 ated by a short circuit current due to a large amplitude of the clock signal, which may cause the gate driver to be burned by the current, so that the display device is damaged, and even a potential safety problem may be caused.

LEVEL SHIFTING UNIT, LEVEL SHIFTING CIRCUIT, METHOD FOR DRIVING THE LEVEL SHIFTING CIRCUIT, GATE DRIVING CIRCUIT AND DISPLAY DEVICE

CROSS-REFERENCE TO RELATED APPLICATION APPLICATIONS

This application is the U.S. national phase of PCT Application No. PCT/CN2016/095949 filed on Aug. 19, 2016, which claims priority to Chinese Patent Application No. 201610013117.2 filed on Jan. 8, 2016, the disclosures of which are incorporated in their entirety by reference herein.

TECHNICAL FIELD

The present disclosure relates to the field of display technology, and in particular to a level shifting unit, a level shifting circuit, a method for driving the level shifting circuit, a gate driving circuit and a display device.

BACKGROUND

Currently, most common flat panel display devices include liquid crystal displays (LCDs) and organic light emitting diode displays (OLEDs). The display area of the flat panel display device comprises a plurality of pixel areas formed by gate lines and data lines which are arranged in a crossing manner, and each of the pixel areas is provided with a thin film transistor (TFT) for controlling display. The TFT is driven by a driving unit located in the non-display area to achieve image displaying function of pixels. The drive unit includes a gate driver and a source driver, wherein the gate driver is used for scanning and turning on multi-channel RGB pixels in the same row in the display screen, and the source driver is configured to provide display data for the turned-on multi-channel RGB pixels.

The clock signal of the gate driver is provided by a level shifting circuit. The level shifting circuit is generally used to convert an inputted small-amplitude level signal into a large-amplitude level signal for driving pixels through the gate lines and the TFTs. During actual use, since the wiring space is limited, a crossing of clock signal lines is likely to occur upon the clock signal lines are being arranged. Once a short circuit occurs at a position where the clock signal lines cross each other, the clock signal will be short circuited during the displaying. As a result, a large short circuit current is generated due to the large amplitude of the clock signal, which may cause the gate driver to be burned by the current, so that the display device is damaged, and even a potential safety problem may be caused.

SUMMARY

(I) Technical Problem to be Solved

The present disclosure aims to provide a level shifting unit, a level shifting circuit, a method for driving the level shifting circuit, a gate driving circuit and a display device with a high safety, to solve the above-mentioned problem in the existing level shifting circuit.

(II) Technical Solution

For solving the above-mentioned problem, the present disclosure provides a level shifting unit, comprising: a logic control module, an output module, an output control module and a feedback module. The logic control module is connected to a turn-on power supply, a driving power supply, an input signal terminal and the output module, and configured to generate a control signal opposite to an input signal, select a logic level signal outputted by the driving power supply corresponding to a polarity of the turn-on power supply according to the control signal, and transmit the logic level signal to the output module. The feedback module is connected to an enable signal terminal, a signal output terminal and the output control module, and configured to output a feedback signal according to signals inputted from the enable signal terminal and the signal output terminal, and transmit the feedback signal to the output control module. The output control module is connected to the output module and the driving power supply, and configured to control the driving power supply to or not to output the logic level signal inputted from the driving power supply to the output module according to the feedback signal. The output module is connected to the signal output terminal, and configured to control an output of the signal output terminal under the control of the logic level signal outputted by the driving power supply and the output control module.

In a possible embodiment, the logic control module comprises a first transistor, a second transistor, a third transistor, a fourth transistor, a first resistor, and a first inverter. Each of the first transistor and the fourth transistor has first switching characteristics, and each of the second transistor and the third transistor has second switching characteristics. An input terminal of the first inverter is connected to the input signal terminal, an output terminal of the first inverter is connected to a control electrode of the first transistor, a control electrode of the second transistor, a control electrode of the third transistor, and a control electrode of the fourth transistor. A first electrode of the first transistor is connected to the output module and a first terminal of the first resistor, and a second electrode of the first transistor is connected to a turn-on voltage terminal of the turn-on power supply. A first electrode of the second transistor is connected to a second terminal of the first resistor and the output module, and a second electrode of the second transistor is connected to a grounding terminal of the turn-on power supply. A first electrode of the third transistor is connected to a high level signal terminal of the driving power supply, and a second electrode of the third transistor is connected to the first electrode of the first transistor, a first terminal of the first resistor and the output module. A first electrode of the fourth transistor is connected to a low level signal terminal of the driving power supply, a second electrode of the fourth transistor is connected to a second terminal of the first resistor, the first electrode of the second transistor and the output module.

In a possible embodiment, the output module comprises a fifth transistor and a sixth transistor. The fifth transistor has the first switching characteristics and the sixth transistor has the second switching characteristics. A first electrode of the fifth transistor is connected to the signal output terminal and a first electrode of the sixth transistor, a second electrode of the fifth transistor is connected to the output control module, and a control electrode of the fifth transistor is connected to the logic control module. The first electrode of the sixth transistor is connected to the signal output terminal, a second electrode of the sixth transistor is connected to the output control module, and a control electrode of the sixth transistor is connected to the logic control module.

In a possible embodiment, the output control module comprises a seventh transistor and an eighth transistor, the seventh transistor has the first switching characteristics and the eighth transistor has the second switching characteristics. A second electrode of the seventh transistor is connected to a high level signal terminal of the driving power supply, and a control terminal of the seventh transistor is connected to the feedback module. A second electrode of the eighth transistor is connected to a low level signal terminal of the driving power supply, and a control terminal of the eighth transistor is connected to the feedback module.

In a possible embodiment, the feedback module comprises a voltage comparator, an OR gate and a second inverter. A first input terminal of the voltage comparator is connected to a first reference voltage terminal, a second input terminal of the voltage comparator is connected to a second reference voltage terminal, a third input terminal of the voltage comparator is connected to the signal output terminal, and an output terminal of the voltage comparator is electrically connected to a first input terminal of the OR gate. A second input terminal of the OR gate is connected to the enable signal terminal, and an output terminal of the OR gate is connected to an input terminal of the second inverter. The input terminal of the second inverter is connected to the output control module, and an output terminal of the second inverter is connected to the output control module.

In a possible embodiment, the level shifting unit further includes: an enable signal generating module configured to output a high level signal at a power-on time, and input the high level signal into the feedback module through the enable signal terminal, and the feedback module outputs a feedback signal, to control the output control module to be turned on.

In a possible embodiment, the enable signal generating module comprises: a second resistor, a ninth transistor and a first capacitor, the ninth transistor has second switching characteristics. A first terminal of the second resistor is connected to a high level signal terminal of the driving power supply, and a second terminal of the second resistor is connected to the enable signal terminal. A first electrode of the ninth transistor is connected to the enable signal terminal, a second electrode of the ninth transistor is connected to a low level signal terminal of the driving power supply, and a control electrode of the ninth transistor is connected to a high level signal terminal of the driving power supply. A first terminal of the first capacitor is connected to the control electrode of the ninth transistor, and a second terminal of the first capacitor is connected to a low level signal terminal of the driving power supply.

In addition, for solving the above-mentioned problem, the present disclosure further provides a level shifting circuit including a plurality of the above-mentioned level shifting units.

In a possible embodiment, the level shifting unit comprises a voltage comparator, an OR gate, and a second inverter. The level shift circuit further includes an NOR gate. The input terminals of the NOR gate are connected to output terminals of the voltage comparators of the feedback modules respectively, and an output terminal of the NOR gate is connected to the first input terminals of the OR gates of the feedback modules.

In addition, for solving the above-mentioned problem, the present disclosure further provides a method for driving a level shifting circuit. The level shifting circuit is the above-mentioned level shifting circuit, and the method comprises: during a power-on output phase, inputting, by the enable signal terminals, the enable signals respectively; controlling, by the feedback modules, the output control modules to be turned on according to the enable signals respectively; generating, by the logic control modules, the control signals opposite to the input signals inputted by the input signal terminals according to the input signals respectively; selecting, by the logic control modules, the logic level signals inputted by the driving power supplies corresponding to polarities of the turn-on power supplies according to the control signals respectively; and outputting, by the logic control modules, the logic level signals through the output modules respectively; and during a feedback phase, controlling, by the feedback modules, the output control modules to be turned on or turned off to control outputs of the output modules according to the signals outputted by the signal output terminals of the level shifting units respectively.

In a possible embodiment, the level shifting unit comprises a voltage comparator, an OR gate and a second inverter. The level shifting circuit further includes an NOR gate. The method further comprises: during the feedback phase, outputting, by the voltage comparators of the feedback modules of the plurality of level shifting units, first control signals to the NOR gate respectively according to the signals outputted by the respective signal output terminals, outputting, by the NOR gate, second control signals according to the first control signals outputted by the voltage comparators of the feedback modules respectively, and controlling, by the NOR gate, all of the output control modules to be turned on or turned off simultaneously to control the outputs of the output modules through the second inverters and the OR gates of the feedback modules.

In addition, for solving the technical problem, the present disclosure further provides a gate driving circuit including the above-mentioned level shifting circuit.

(III) Beneficial Effect

The present disclosure possesses at least the following beneficial effects: in the level shifting unit provided by the present embodiment, the feedback module may control to turn on or turn off the output module through the signals inputted by the enable signal terminal and the signal output terminal. In particular, if the signals outputted by two level shifting units are short circuited in the level shifting circuit, the signals outputted by the two level shifting units are inevitably changed, so the feedback module may compare the received signal outputted by the signal output terminal with a preset level to determine whether a short circuit occurs. When it is determined which one of the level shifting units is short circuited, a feedback signal is outputted to control the output control module of the level shifting circuit to be disconnected, so that the output module is in a high impedance state, thereby preventing the gate driver from being burnt down and solving a potential safety problem.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The transistors employed in various embodiments of the present disclosure may be thin film transistors, field effect transistors or similar devices with other characteristics. Since the source electrode and the drain electrode of the transistor are symmetric, the source electrode and the drain electrode of the transistor are same. In the various embodiments of the present disclosure, in order to distinguish the source electrode and the drain electrode of the transistor, one of the source electrode and the drain electrode is referred to as the first electrode, and the other one is referred to as the second electrode, and the gate electrode is referred to as the control electrode. In addition, the transistors may be divided into N-type transistors and P-type transistors according to the characteristics of the transistors. In the following embodiments, transistors having first switching characteristics are the P-type transistors, and transistors having second switching characteristics are the N-type transistors. In the N-type transistor, the source electrode of the N-type transistor is the first electrode, and the drain electrode of the N-type transistor is the second electrode, when a high level is inputted into the gate electrode, the source electrode and the drain electrode are turned on. The situation for the P-type transistor is reversed. It should be understood that a person skilled in the art may readily envisage, without any creative work, using the N-type transistors as the transistors having the first switching characteristics and the P-type transistors as the transistors having the second switching characteristics, which also falls in the protection scope of the embodiments of the present disclosure.

The present disclosure will be specifically described in conjunction with accompanying drawings and embodiments. The following embodiments are merely illustrative of the present disclosure and are not intended to limit the scope of the present disclosure.

First Embodiment

Figure 1:
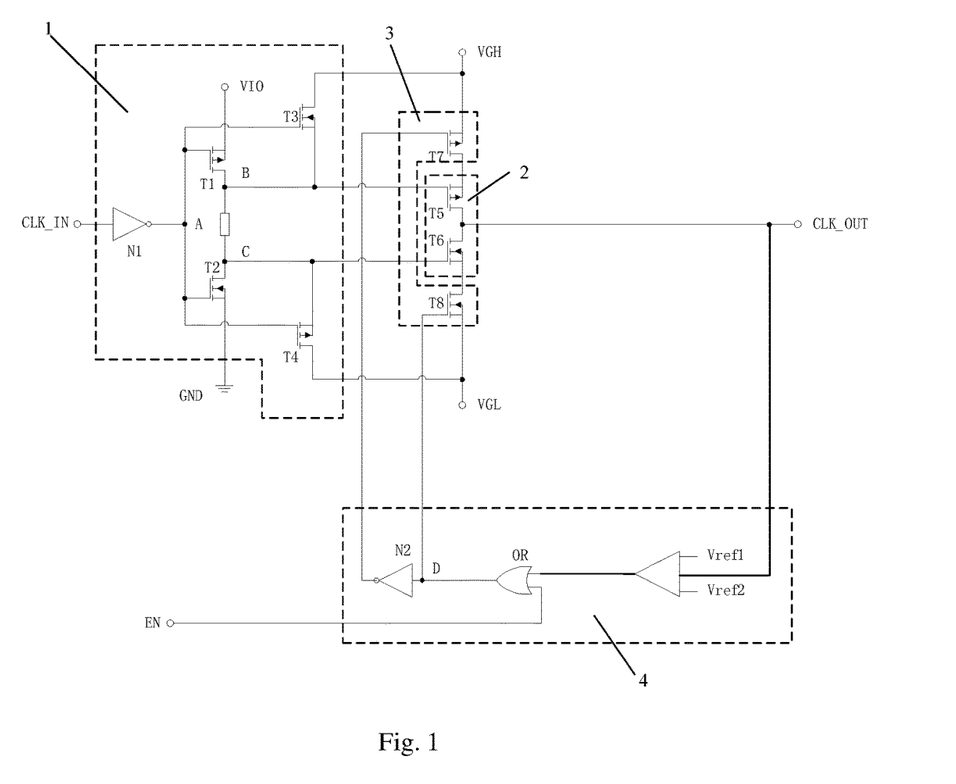
FIG. 1 is a schematic diagram of a level shifting unit provided by a first embodiment of the present disclosure.

As shown in FIG. 1, this embodiment provides a level shifting unit, which includes: a logic control module 1, an output module 2, an output control module 3 and a feedback module 4. The logic control module 1 is connected to a turn-on power supply, a driving power supply, an input signal terminal CLK_IN and the output module 2, and configured to generate a control signal which is opposite to the input signal. The logic control module 1 is further configured to select a logic level signal outputted by the driving power supply corresponding to a polarity of the turn-on power supply according to the control signal, and transmit the logic level signal to the output module 2. The feedback module 4 is connected to an enable signal terminal EN, a signal output terminal CLK_OUT and the output control module 3, and configured to output a feedback signal according to signals inputted from the enable signal terminal EN and the signal output terminal CLK_OUT and transmit the feedback signal to the output control module 3. The output control module 3 is connected to the output module 2 and the driving power supply, and configured to control the driving power supply to or not to output the logic level signal inputted from the driving power supply to the output control module 3 according to the feedback signal. The output module 2 is connected to the signal output terminal CLK_OUT, and configured to control the output of the signal output terminal CLK_OUT under the control of the logic level signal outputted by the driving power supply and the output control module 3.

In the level shifting unit of the present embodiment, the feedback module 4 may control the output module 2 to be turned on or turned off according to the signals inputted by the enable signal terminal EN and the signal output terminal CLK_OUT. In particular, if the signals outputted by two level shifting units are short circuited in the level shifting circuit, the signals outputted by the two level shifting units are inevitably changed, so the feedback module 4 may compare the received signal outputted by the signal output terminal CLK_OUT with a preset level to determine whether a short circuit occurs. When it is determined which one of the level shifting units is short circuited, a feedback signal is outputted to control the output control module of the level shifting circuit to be disconnected, so that the output module 2 is in a high impedance state, thereby preventing the gate driver from being burnt down and solving a potential safety problem.

The logic control module 1 includes a first transistor T1, a second transistor T2, a third transistor T3, a fourth transistor T4, a first resistor R1, and a first inverter N1. The first transistor T1 and the third transistor T3 have the first switching characteristics, and the second transistor T2 and the fourth transistor T4 have the second switching characteristics. Certainly, the present disclosure should not be construed to be limited thereto, and other arrangements may be devised by a person skilled in the art as required. For example, the first transistor T1 and the third transistor T3 have the second switching characteristics, and the second transistor T2 and the fourth transistor T4 have the first switching characteristics. The input terminal of the first inverter N1 is connected to the input signal terminal CLK_IN, and the output terminal of the first inverter N1 is connected to the control electrode of the first transistor T1, the control electrode of the second transistor T2, the control electrode of the third transistor T3, and the control electrode of the fourth transistor T4. The first electrode of the first transistor T1 is connected to the output module 2 and the first terminal of the resistor, and the second electrode of the first transistor T1 is connected to the turn-on voltage terminal of the turn-on power supply. The first electrode of the second transistor T2 is connected to the second terminal of the resistor R1 and the output module 2, and the second electrode of the second transistor T2 is connected to the grounding terminal GND of the turn-on power supply. The first electrode of the third transistor T3 is connected to the high level signal terminal VGH of the driving power supply, and the second electrode of the third transistor T3 is connected to the first terminal of the first transistor T1, the first terminal of the first resistor R1, and the output module 2. The first electrode of the fourth transistor T4 is connected to the low level signal terminal VGL of the driving power supply, and the second electrode of the fourth transistor T4 is connected to the second terminal of the first resistor R1, the first terminal of the second transistor T2, and the output module 2.

Specifically, it is assumed that a signal VIO=3.3V is inputted from the working voltage terminal VIO of the turn-on power supply, and the grounding terminal is grounded; a signal VGH=30V is inputted from the high level signal terminal VGH of the driving power supply, and a signal VGL=−8V is inputted from the low level signal terminal VGL.

When the signal inputted from the input signal terminal CLK_IN has a high level of 3.3V, the control signal outputted by the first inverter N1, i.e. the potential at the node A, has a level of 0V. At this point, the first transistor T1 and the fourth transistor T4 are turned on, the second transistor T2 and the third transistor T3 are turned off, and the voltage of 3.3V inputted from the working voltage terminal VIO of the turn-on power supply produces a potential of 3.3V at the node B through the first transistor T1. Since the fourth transistor T4 is turned on, the −8V voltage inputted from the low-level signal terminal VGL of the driving power supply reaches the node C through the fourth transistor T4. Therefore, the potential at the node C is −8V. That is, the −8V voltage is transmitted to the output module 2 to control the output of the output module 2.

When the signal inputted from the input signal terminal CLK_IN has a low level of 0V, the control signal outputted by the first inverter N1, i.e. the potential at the node A, has a level of 3.3V. At this point, the first transistor T1 and fourth transistor T4 are turned off, and the second transistor T2 and third transistor T3 are turned on. At this point, the grounding terminal of the turn-on power supply is grounded, and the inputted voltage of 0V reaches the node C through the second transistor T2, and the potential at the node C is 0V. Since the third transistor T3 is turned on, the voltage of 30V inputted from the high level signal terminal of the driving power supply reaches the node B through the third transistor T3, and thus the potential at the node B is 30V. That is, the voltage of 30V is transmitted to the output module 2 to control the output of the output module 2.

It should be noted that the node A is the output node of the first inverter N1, and the nodes B and C are the connecting nodes of the logic control module 1 and the output module 2.

The output module 2 includes a fifth transistor T5 and a sixth transistor T6. The fifth transistor T5 has the first switching characteristics, and the sixth transistor T6 has the second switching characteristics. Certainly, the present disclosure should not be construed to be limited thereto, and other arrangements may be devised by a person skilled in the art as required. For example, the fifth transistor T5 has the second switching characteristics, and the sixth transistor T6 has the first switching characteristics. The first electrode of the fifth transistor T5 is connected to the signal output terminal CLK_OUT and the first electrode of the sixth transistor T6, the second electrode of the fifth transistor T5 is connected to the output control module 3, and the control electrode of the fifth transistor T5 is connected to the logic control module 1. The first electrode of the sixth transistor T6 is connected to the signal output terminal CLK_OUT, and the second electrode of the sixth transistor T6 is connected to the output control module 3, and the control electrode of the sixth transistor T6 is connected to the logic control module 1.

When the signal inputted from the input signal terminal CLK_IN has a high level of 3.3V, the potential at the node A is 0V, and the node B outputs the working voltage of the turn-on power supply, i.e. the above-mentioned 3.3V. When the potential at the node C is the signal inputted from the low level signal terminal VGL of the driving power supply, i.e. the above-mentioned −8V, the fifth transistor T5 is turned on and the sixth transistor T6 is turned off.

When the input signal has a low level of 0V, the potential at the node A is above-mentioned 3.3V, the potential at the node B is the signal inputted from the high level signal terminal VGH of the driving power supply, i.e. the above-mentioned 30V, and the potential at the node C is the potential at the grounding terminal of the turn-on power supply, i.e. 0V, the fifth transistor T5 is turned off, and the sixth transistor T6 is turned on.

The output control module 3 includes a seventh transistor T7 and an eighth transistor T8. The seventh transistor T7 has the first switching characteristics, and the eighth transistor T8 has the second switching characteristics. Certainly, the present disclosure should not be construed to be limited thereto, and other arrangements may be devised by a person skilled in the art as required. For example, the seventh transistor T7 has the second switching characteristics, and the eighth transistor T8 has the first switching characteristics. The second electrode of the seventh transistor T7 is connected to the high level signal terminal VGH of the driving power supply, and the control electrode of the seventh transistor T7 is connected to the feedback module 4. The second electrode of the eighth transistor T8 is connected to the low level signal terminal VGL of the driving power supply, and the control electrode of the eighth transistor T8 is connected to the feedback module 4.

Specifically, since the seventh transistor T7 and the fifth transistor T5 have the same switching characteristics, the signal inputted from the high level signal terminal VGH of the driving power supply is outputted from the signal output terminal CLK_OUT through the seventh transistor T7 and the fifth transistor T5 when the seventh transistor T7 and fifth transistor T5 both are turned on. Since the eighth transistor T8 and the sixth transistor T6 have the same switching characteristics, the signal inputted from the low level signal terminal VGL of the driving power supply is outputted from the signal output terminal CLK_OUT through the eighth transistor T8 and the sixth transistor T6 when the eighth transistor T8 and sixth transistor T6 both are turned on.

The feedback module 4 includes a voltage comparator, an OR gate and a second inverter N2. A first input terminal of the voltage comparator is connected to a first reference voltage terminal Vref1, a second input terminal of the voltage comparator is connected to a second reference voltage terminal Vref2, a third input terminal of the voltage comparator is connected to the signal output terminal CLK_OUT, and an output terminal of the voltage comparator is electrically connected to a first input terminal of the OR gate. A second input terminal of the OR gate is connected to the enable signal terminal EN, and an output terminal of the OR gate is connected to an input terminal of the second inverter N2. The input terminal of the second inverter N2 is connected to the output control module 3, and an output terminal of the second inverter N2 is also connected to the output control module 3.

Specifically, at a power-on time, a high level signal is inputted from the enable signal terminal EN, and at other time, a low level signal is inputted from the enable signal terminal EN. In the present embodiment, at the power-on time, the high level enable signal is inputted into one input terminal of the OR gate, and the output terminal of the OR gate outputs a high level signal regardless of the level of the other terminal. That is, the potential at the node D is high. If the output control module 3 is the above-mentioned output control module 3 including the seventh transistor T7 and the eighth transistor T8, the eighth transistor T8 is turned on under the control of the high potential at the node D, and the potential at the node D is used as the input signal of the second inverter N2. At this point, the second inverter N2 outputs a low potential and controls the seventh transistor T7 to be turned on. That is, at the power-on time, the feedback module 4 is used to control the output control module 3 to be turned on. After the power-on time, the output control module 3 selects to output the signal inputted from the high level signal terminal VGH or the low level signal terminal VGL of the driving power supply according to the states of the fifth transistor T5 and the sixth transistor T6 in the output module 2. During the normal output state, the voltage comparator in the feedback module 4 collects the output of the signal output terminal CLK_OUT in real time, and compares the voltage outputted from the signal output terminal CLK_OUT with a first reference voltage inputted from the first reference voltage terminal Vref1 of the voltage comparator and a second reference voltage inputted from a second reference voltage terminal Vref2 of the voltage comparator. If the outputted voltage is between the two reference voltages, it means the signal of the signal output terminal CLK_OUT is short circuited by the output signal of another level shifting unit. At this point, the voltage comparator is controlled to output a logic level signal, e.g. a low level signal, and a low level is inputted into the first input terminal of the OR gate, and the second input terminal of the OR gate is connected to the enable signal terminal EN and thus the low level is inputted into the second input terminal of the OR gate. At this point, the output terminal of the OR gate is at the low level, i.e. the potential at the node D is low. Accordingly, the eighth transistor T8 is turned off, the potential of the node D turns to be high through the second inverter N2. At the same time, the seventh transistor T7 is also turned off, so that the output of the output module 2 is in a high impedance state. Certainly, if the output signal of the signal output terminal CLK_OUT is not between the first reference voltage and the second reference voltage, i.e. the output of the signal output terminal CLK_OUT is normal, the voltage comparator is controlled to output a high level signal. At this point, the high level is inputted into the first input terminal of the OR gate and the low level is inputted into the second input terminal which is connected to the enable signal terminal EN. The OR gate outputs the high level, i.e. the potential at the node D is high, and thus the eighth transistor T8 is turned on. The potential of the node D turns to be low through the second inverter N2, and thus the seventh transistor T7 is also turned on, so that the signal output terminal CLK_OUT maintains a normal output.

Figure 2:
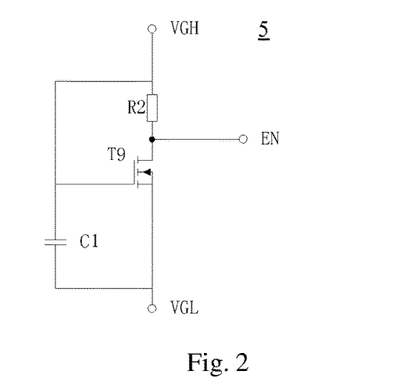
FIG. 2 is a schematic diagram of an enable signal generating module provided by a first embodiment of the present disclosure.

As shown in FIG. 2, the level shifting unit of the present embodiment may further include an enable signal generating module 5 which is configured to output a high level signal at the power-on time, and input the high level signal into the feedback module 4 through the enable signal terminal EN, so that the feedback module outputs a feedback signal to control the output control module 3 to be turned on.

For example, as shown in FIG. 2, the enable signal generating module 5 may include: a second resistor R2, a ninth transistor T9, and a first capacitor C1. The ninth transistor T9 has the second switching characteristics. The first terminal of the second transistor R2 is connected to the high level signal terminal VGH of the driving power supply, and the second terminal of the second resistor R2 is connected to the enable signal terminal EN. The first electrode of the ninth transistor T9 is connected to the enable signal terminal EN, the second electrode of the ninth transistor T9 is connected to the low level signal terminal VGL of the driving power supply, and the control electrode of the ninth transistor T9 is connected to the high level signal terminal VGH of the driving power supply. A first terminal of the first capacitor C1 is connected to the control electrode of the ninth transistor T9, and a second terminal of the first capacitor C1 is connected to the low level signal terminal VGL of the driving power supply.

Specifically, when the level shifting unit is powered on, since the first capacitor C1 needs to be charged, the potential at the control electrode of the ninth transistor T9 is low and thus the ninth transistor T9 is turned off and the signal outputted from the high level signal terminal VGH of the driving power supply is outputted from the enable signal terminal EN, i.e. the enable signal terminal EN outputs a high level. After the charging of the first capacitor C1 is completed, the potential at the control electrode of the ninth transistor T9 is high and thus the ninth transistor T9 is turned on and the signal outputted from the low level signal terminal VGL of the driving power supply is outputted from the enable signal terminal EN, i.e. the output of the enable signal terminal EN turns to be in the low level.

Second Embodiment

Figure 3:
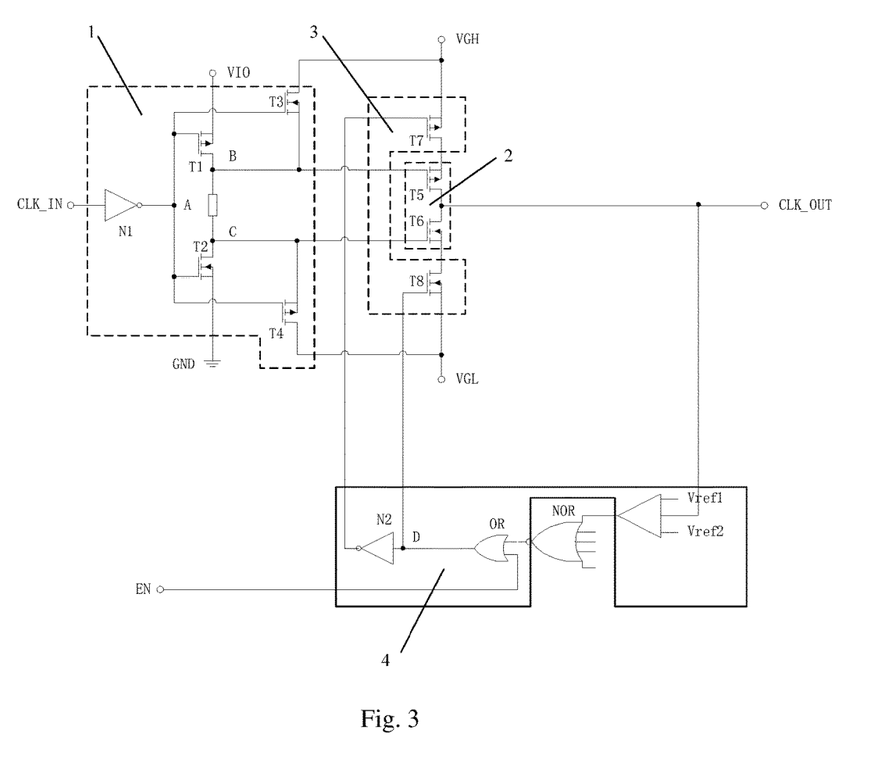
FIG. 3 is a schematic diagram of a level shifting circuit provided by a second embodiment of the present disclosure.

As shown in FIGS. 1 and 3, the present embodiment provides a level shifting circuit, which includes a plurality of level shifting units provided by the first embodiment.

When the feedback module 4 includes the voltage comparator, the OR gate and the second inverter N2, preferably, the level shifting circuit of the present embodiment further includes an NOR gate. Input terminals of the NOR gate are connected to output terminals of the voltage comparators of the feedback modules 4 respectively, and the output terminal of the NOR gate is connected to the first input terminals of the OR gates of the feedback modules 4.

Specifically, at the power-on time, a high level signal is inputted from the enable signal terminal EN, and at other time, a low level signal is inputted from the enable signal terminal EN. In the present embodiment, at the power-on time, the high level enable signal is inputted into one input terminal (second input terminal) of the OR gate, and the output terminal of the OR gate are in the high level regardless of the level of the other terminal (first input terminal).

That is, the potential at the node D is high. If the output control module 3 is the above-mentioned output control module 3 including the seventh transistor T7 and the eighth transistor T8, the eighth transistor T8 is turned on under the control of the high potential at the node D, and the potential at the node D is used as the input signal of the second inverter N2. At this point, the second inverter N2 outputs a low potential and controls the seventh transistor T7 to be turned on. That is, at the power-on time, the feedback module 4 is used to control the output control module 3 to be turned on. After the power-on time, the output control module 3 selects to output the signal inputted from the high level signal terminal VGH or the low level signal terminal VGL of the driving power supply according to the states of the fifth transistor T5 and the sixth transistor T6 in the output module 2. During the normal output state, the voltage comparator in the feedback module 4 collects the output of the signal output terminal CLK_OUT in real time, and compares the voltage outputted from the signal output terminal CLK_OUT with a first reference voltage inputted from the first reference voltage terminal Vref1 of the voltage comparator and a second reference voltage inputted from a second reference voltage terminal Vref2 of the voltage comparator. If the output voltage is between the two reference voltages, it means the signal of the signal output terminal CLK_OUT is short circuited by the output signal of another level shifting unit. At this point, the voltage comparator is controlled to output a logic level signal (i.e. a first control signal), e.g. a high level signal, and the NOR gate outputs a low level (i.e. a second control signal). The first input terminal of the OR gate of each level shifting unit is connected to the NOR gate, i.e. a low level is inputted into the first input terminal of the OR gate and the second input terminal of the OR gate is connected to the enable signal terminal EN. The signal outputted from the enable signal terminal EN is a high level signal at the power-on time, and is a low level signal at other time, that is, a low level is inputted into the second input terminal of the OR gate, and thus a low level is outputted, i.e. the potential at the node D is low. Accordingly, the eighth transistor T8 is turned off and the potential of the node D is turned to be a high level through the second inverter N2. Meanwhile, the seventh transistor T7 is also turned off so that the output of the output module 2 of each potential shift unit is in a high impedance state. Certainly, if the output signal of the signal output terminal CLK_OUT is not between the first reference voltage and the second reference voltage, i.e. the output of the signal output terminal CLK_OUT is normal and the voltage comparator is controlled to output a low level signal (i.e. the first control signal). Therefore, a low level is provided at the input terminals of the NOR gate, and the NOR gate outputs a high level (i.e. the second control signal). Accordingly, a high level is inputted into the first input terminal of each OR gate connected to the output terminal of the NOR gate, and a low level is inputted into the second terminal of each OR gate connected to the enable signal terminal EN, and thus a high level is output, i.e. the potential at the node D is high. Therefore, the eighth transistor T8 is turned on, and the potential of the node D turns to be a high level through the second inverter N2. Meanwhile, the seventh transistor T7 is also turned on so that the signal output terminal CLK_OUT maintains a normal output.

Since the level shifting circuit of the present embodiment further includes the NOR gate, the output terminal of the NOR gate outputs a low level as long as the voltage comparator of the feedback module 4 of one of the level shifting units outputs a high level. The output terminal of the NOR gate is connected to the first input terminal of the OR gate of the feedback module 4 of each level shifting unit, and the second input terminal of each OR gate is connected to the enable signal terminal EN which outputs a high level signal at the power-on time and a low level signal at other time, i.e. a low level is inputted into the second input terminal of each OR gate, so the output terminal of the OR gate outputs a low level, so as to turn off the seventh transistors T7 and the eighth transistors T8 of each level shifting units, thereby cutting off the outputs of each level shifting unit and ensuring the working safety of the level shifting circuit.

Third Embodiment

The present embodiment provides a method for driving a level shifting circuit. The level shifting circuit includes a plurality of level shifting units provided by the first embodiment. The method specifically includes the following steps.

Figure 4:
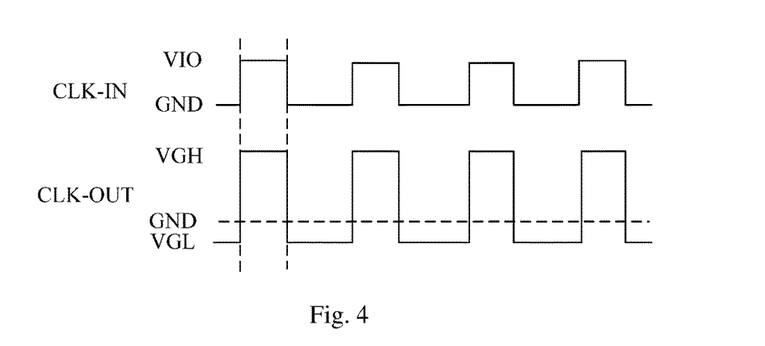
FIG. 4 is a timing diagram of a level shifting unit according to a third embodiment of the present disclosure.

As shown in FIGS. 1 and 4, during a power-on output phase, a signal VIO=3.3V is inputted from the working voltage terminal VIO of the turn-on power supply, and the grounding terminal is grounded. A signal VGH=30V is inputted from the high level signal terminal VGH of the driving power supply, and a signal VGL=−8V is inputted from the low level signal terminal VGL of the driving power supply.

At the power-on time, a high level signal is inputted from the enable signal terminal EN, and at other time, the low level signal is inputted from the enable signal terminal EN. Therefore, at the power-on time, a high level enable signal is inputted into one input terminal of the OR gate, and the output terminal of the OR gate outputs a high level regardless of the level of the other input terminal of the OR gate, i.e. the potential at the node D is high, and the high potential at the node D controls the eighth transistor T8 to be turned on. Meanwhile, the potential at the node D is used as the input signal of the second inverter N2, and thus the output of the second inverter N2 is a low level signal which controls the seventh transistor T7 to be turned on.

When the signal inputted from the input signal terminal CLK_IN has a high level of 3.3V, the control signal outputted by the first inverter N1, i.e. the potential at the node A, has a level of 0V, and thus the first transistor T1 and the fourth transistor T4 are turned on, and the second transistor T2 and the third transistor T3 are turned off. The 3.3V voltage inputted from the working voltage terminal VIO of the turn-on power supply reaches the node B through the first transistor T1, i.e. the potential at the node B is 3.3V. Since the fourth transistor T4 is turned on, the −8V voltage inputted from the low-level signal terminal VGL of the driving power supply reaches the node C through the fourth transistor T4, and accordingly the potential at the node C is −8V. Therefore, the fifth transistor T5 is turned on and the sixth transistor T6 is turned off, and the high level signal inputted from the high level signal terminal VGH of the driving power supply, i.e. the voltage of 30V, is outputted from the signal output terminal CLK_OUT through the seventh transistor T7 and the fifth transistor T5.

When the signal inputted from the input signal terminal CLK_IN has a low level of 0V, the control signal outputted by the first inverter N1, i.e. the potential at the node A, has a level of 3.3V, and thus the first transistor T1 and the fourth transistor T4 are turned off, and the second transistor T2 and the third transistor T3 are turned on. The grounding terminal of the turn-on power supply is grounded, and the input voltage of 0V reaches the node C through the second transistor T2, and the potential at the node C is 0V. Since the third transistor T3 is turned on, the voltage of 30V inputted from the high level signal terminal VGH of the driving power supply reaches the node B through the third transistor T3, and thus the potential at the node B is 30V. At this point, the sixth transistor T6 is turned on and the fifth transistor T5 is turned off, the −8V voltage inputted from the low level signal terminal VGL of the driving power supply is outputted from the signal output terminal CLK_OUT through the eighth transistor T8 and the sixth transistor T6.

At a feedback phase, the voltage comparator in the feedback module 4 collects the output of the signal output terminal CLK_OUT in real time, and compares the voltage outputted from the signal output terminal CLK_OUT with a first reference voltage inputted from the first reference voltage terminal Vref1 of the voltage comparator and a second reference voltage inputted from a second reference voltage terminal Vref2 of the voltage comparator. If the outputted voltage is between the two reference voltages, it means the signal of the signal output terminal CLK_OUT is short circuited by the output signal of another level shifting unit. At this point, the voltage comparator is controlled to output a logic level signal, e.g. a low level signal, and a low level is inputted into the first input terminal of the OR gate and the second input terminal of the OR gate is connected to the enable signal terminal EN, i.e. a low level is also inputted, and thus the output terminal of the OR gate outputs a low level, i.e. the potential at the node D turns to be low. Accordingly, the eighth transistor T8 is turned off, and the potential of the node D turns to be a high level through the second inverter N2. Meanwhile, the seventh transistor T7 is also turned off so that the signal output terminal CLK_OUT is in a high impedance state. Certainly, if the output signal of the signal output terminal CLK_OUT is not between the first reference voltage and the second reference voltage, i.e. the output of the signal output terminal CLK_OUT is normal, the voltage comparator is controlled to output a high level signal. A high level is inputted into the first input terminal of the OR gate and a low level is inputted into the second input terminal of the OR gate which is connected to the enable signal terminal EN. The OR gate outputs a high level, i.e. the potential at the node D is high, and thus the eighth transistor T8 is turned on. The potential of the node D turns to be the low level through the second inverter N2, and thus the seventh transistor T7 is also turned on so that the signal output terminal CLK_OUT maintains a normal output.

The method for driving the level shifting circuit provided by the present embodiment includes a feedback phase, in which the voltage comparator is controlled to output a logic level signal, e.g. a low level signal, and a low level is inputted into the first input terminal of the OR gate and the second input terminal of the OR gate is connected to the enable signal terminal EN, i.e. a low level is also input, and thus the output terminal of the OR gate outputs a low level, i.e. the potential at the node D is low; accordingly, the eighth transistor T8 is turned off and the potential of the node D turns to be a high level through the second inverter N2; meanwhile, the seventh transistor T7 is also turned off. Therefore, the output of the level shifting unit is cut off, thereby ensuring the working safety of the level shifting circuit.

Fourth Embodiment

The present embodiment provides a method for driving a level shifting circuit which includes a plurality of level shifting units provided by the first embodiment and an NOR gate. This method is generally same as the method of the third embodiment except that the feedback phase is different. Therefore, the power-on output phase will not be repeated herein. The feedback phase will be specifically described hereinafter.

As shown in FIGS. 3 and 4, the voltage comparator in the feedback module 4 collects the output of the signal output terminal CLK_OUT in real time, and compares the voltage outputted from the signal output terminal CLK_OUT with a first reference voltage inputted from the first reference voltage terminal Vref1 of the voltage comparator and a second reference voltage inputted from a second reference voltage terminal Vref2 of the voltage comparator. If the output voltage is between the two reference voltages, it means the signal of the signal output terminal CLK_OUT is short circuited by the output signal of another level shifting unit. At this point, the voltage comparator is controlled to output a logic level signal (i.e. the first control signal), e.g. a high level signal, and the NOR gate outputs a low level (i.e. the second control signal), and the first input terminal of the OR gate of each level shifting unit is connected to the NOR gate, that is, a low level is inputted into the first input terminal and the second input terminal of the OR gate is connected to the enable signal terminal EN, i.e. a low level is also inputted, and thus the output terminal of the OR gate outputs a low level, i.e. the potential at the node D is low; accordingly, the eighth transistor T8 is turned off and the potential of the node D turns to be a high level through the second inverter N2; meanwhile, the seventh transistor T7 is also turned off, so that the signal output terminal CLK_OUT of each potential shift circuit is in a high impedance state. Certainly, if the output signal of the signal output terminal CLK_OUT is not between the first reference voltage and the second reference voltage, i.e. the output of the signal output terminal CLK_OUT is normal, the voltage comparator is controlled to output a low level signal (i.e. the first control signal). Low levels are input into the input terminals of the NOR gate. The NOR gate outputs a high level (i.e. a second control signal). Therefore, a high level is inputted into the first input terminal of each OR gate connected to the output terminal of the NOR gate, and a low level is inputted into the second input terminal of each OR gate connected to the enable signal terminal EN, and thus the OR gate outputs a high level. That is, the potential at the node D is high, and thus the eighth transistor T8 is turned on. The potential of the node D turns to be low through the second inverter N2, and thus the seventh transistor T7 is also turned on, so that the signal output terminal CLK_OUT maintains a normal output.

According to the method for driving the level shifting circuit provided by the present embodiment, the output terminal of the NOR gate outputs a low level as long as the voltage comparator of the feedback module 4 of one of the level shifting units outputs a high level. The output terminal of the NOR gate is connected to the first input terminal of the OR gate of the feedback module 4 of each level shifting unit, and the second input terminal of each OR gate is connected to the enable signal terminal EN which outputs a high level at the power-on time and outputs a low level at other time, i.e. a low level is inputted into the second input terminal of each OR gate, and thus the output terminal of the OR gate outputs a low level, so as to turn off the seventh transistor T7 and the eighth transistor T8 of each level shifting unit, thereby cutting off the output of each level shifting unit and ensuring the working safety of the level shifting circuit.

Fifth Embodiment

The present embodiment provides a further gate driving circuit which includes the level shifting circuit provided by the second embodiment. Certainly, the gate driving circuit may further include other components such as a shift register, which will not be specifically described herein.

The gate driving circuit provided by the present embodiment includes the above-mentioned level shifting circuit, and thus provides a good performance and ensures the working safety.

Sixth Embodiment

The present embodiment provides a display device which includes any one of the above-mentioned gate driving circuits.

The display device provided by the sixth embodiment of the present disclosure may be any product or component having a display function such as a notebook computer display screen, a monitor, a television, a digital photo frame, a mobile phone, and a tablet computer.

The above are merely the optional embodiments of the present disclosure. A person skilled in the art may make further modifications and improvements without departing from the principle and the spirit of the present disclosure, and these modifications and improvements shall also fall within the scope of the present disclosure.

What is claimed is:

1. A level shifting unit, comprising: a logic control module, an output module, an output control module and a feedback module, wherein the logic control module is connected to a turn-on power supply, a driving power supply, an input signal terminal and the output module, and configured to generate a control signal opposite to an input signal, select a logic level signal outputted by the driving power supply corresponding to a polarity of the turn-on power supply according to the control signal, and transmit the logic level signal to the output module; the feedback module is connected to an enable signal terminal, a signal output terminal and the output control module, and configured to output a feedback signal according to signals inputted from the enable signal terminal and the signal output terminal, and transmit the feedback signal to the output control module; the output control module is connected to the output module and the driving power supply, and configured to control the driving power supply to or not to output the logic level signal to the output module according to the feedback signal, wherein the logic level signal is inputted from the driving power supply; and the output module is connected to the signal output terminal, and configured to control output of the signal output terminal under the control of the logic level signal outputted by the driving power supply and the output control module; and wherein the logic control module comprises a first transistor, a second transistor, a third transistor, a fourth transistor, a first resistor, and a first inverter, each of the first transistor and the fourth transistor has first switching characteristics, and each of the second transistor and the third transistor has second switching characteristics; an input terminal of the first inverter is connected to the input signal terminal, and an output terminal of the first inverter is connected to a control electrode of the first transistor, a control electrode of the second transistor, a control electrode of the third transistor, and a control electrode of the fourth transistor; a first electrode of the first transistor is connected to the output module and a first terminal of the first resistor, and a second electrode of the first transistor is connected to a turn-on voltage terminal of the turn-on power supply; a first electrode of the second transistor is connected to a second terminal of the first resistor and the output module, and a second electrode of the second transistor is connected to a grounding terminal of the turn-on power supply; a first electrode of the third transistor is connected to a high level signal terminal of the driving power supply, and a second electrode of the third transistor is connected to the first electrode of the first transistor, the first terminal of the first resistor and the output module; and a first electrode of the fourth transistor is connected to a low level signal terminal of the driving power supply, and a second electrode of the fourth transistor is connected to the second terminal of the first resistor, the first electrode of the second transistor and the output module.

2. The level shifting unit according to claim 1, wherein the output module comprises a fifth transistor and a sixth transistor, the fifth transistor has the first switching characteristics, and the sixth transistor has the second switching characteristics;

a first electrode of the fifth transistor is connected to the signal output terminal and a first electrode of the sixth transistor, a second electrode of the fifth transistor is connected to the output control module, and a control electrode of the fifth transistor is connected to the logic control module; and the first electrode of the sixth transistor is connected to the signal output terminal, a second electrode of the sixth transistor is connected to the output control module, and a control electrode of the sixth transistor is connected to the logic control module.

3. The level shifting unit according to claim 1, wherein the output control module comprises a seventh transistor and an eighth transistor, the seventh transistor has the first switching characteristics, and the eighth transistor has the second switching characteristics, wherein a second electrode of the seventh transistor is connected to a high level signal terminal of the driving power supply, and a control terminal of the seventh transistor is connected to the feedback module; and a second electrode of the eighth transistor is connected to a low level signal terminal of the driving power supply, and a control terminal of the eighth transistor is connected to the feedback module.

4. The level shifting unit according to claim 1, wherein the feedback module comprises a voltage comparator, an OR gate and a second inverter;

a first input terminal of the voltage comparator is connected to a first reference voltage terminal, a second input terminal of the voltage comparator is connected to a second reference voltage terminal, a third input terminal of the voltage comparator is connected to the signal output terminal, and an output terminal of the voltage comparator is electrically connected to a first input terminal of the OR gate;

a second input terminal of the OR gate is connected to the enable signal terminal, and an output terminal of the OR gate is connected to an input terminal of the second inverter; and the input terminal of the second inverter is connected to the output control module, and an output terminal of the second inverter is connected to the output control module.

5. The level shifting unit according to claim 1, further comprising: an enable signal generating module configured to output a high level signal at a power-on time, and input the high level signal into the feedback module through the enable signal terminal, wherein the feedback module outputs a feedback signal, to control the output control module to be turned on.

6. The level shifting unit according to claim 5, wherein
the enable signal generating module comprises: a second resistor, a ninth transistor and a first capacitor, the ninth transistor has second switching characteristics;
a first terminal of the second resistor is connected to a high level signal terminal of the driving power supply, and a second terminal of the second resistor is connected to the enable signal terminal;
a first electrode of the ninth transistor is connected to the enable signal terminal, a second electrode of the ninth transistor is connected to a low level signal terminal of the driving power supply, and a control electrode of the ninth transistor is connected to a high level signal terminal of the driving power supply; and
a first terminal of the first capacitor is connected to the control electrode of the ninth transistor, and a second terminal of the first capacitor is connected to the low level signal terminal of the driving power supply.

7. A level shifting circuit, comprising:
a plurality of level shifting units each according to claim 1.

8. A level shifting circuit, comprising: a plurality of level shifting units each according to claim 4, and an NOR gate, wherein
input terminals of the NOR gate are connected to output terminals of the voltage comparators of the feedback modules respectively, and an output terminal of the NOR gate is connected to the first input terminals of the OR gates of the feedback modules.

9. A method for driving the level shifting circuit according to claim 7, wherein the method comprises:
during a power-on output phase, inputting, by the enable signal terminals, the enable signals respectively; controlling, by the feedback modules, the output control modules to be turned on according to the enable signals respectively; generating, by the logic control modules, the control signals opposite to the input signals inputted by the input signal terminals according to the input signals respectively; selecting, by the logic control modules, the logic level signals inputted by the driving power supplies corresponding to polarities of the turn-on power supplies according to the control signals respectively; and outputting, by the logic control modules, the logic level signals through the output modules respectively; and
during a feedback phase, controlling, by the feedback modules, the output control modules to be turned on or turned off to control outputs of the output modules according to the signals outputted by the signal output terminals of the level shifting units respectively.

10. A method for driving the level shifting circuit according to claim 8, wherein the method comprises:
during a power-on output phase, inputting, by the enable signal terminals, the enable signals respectively; controlling, by the feedback modules, the output control modules to be turned on according to the enable signals respectively; generating, by the logic control modules, the control signals opposite to the input signals inputted by the input signal terminals according to the input signals respectively; selecting, by the logic control modules, the logic level signals inputted by the driving power supplies corresponding to polarities of the turn-on power supplies according to the control signals respectively; and outputting, by the logic control modules, the logic level signals through the output modules respectively; and
during a feedback phase, controlling, by the feedback modules, the output control modules to be turned on or turned off to control outputs of the output modules according to the signals outputted by the signal output terminals of the level shifting units respectively, wherein
during the feedback phase, outputting, by the voltage comparators of the feedback modules of the plurality of level shifting units, first control signals to the NOR gate respectively according to the signals outputted by the respective signal output terminals; outputting, by the NOR gate, second control signals according to the first control signals outputted by the voltage comparators of the feedback modules respectively; and controlling, by the NOR gate, all of the output control modules to be turned on or turned off simultaneously through the second inverters and the OR gates of the feedback modules, to control the outputs of the output modules.

11. A gate driving circuit, comprising:
the level shifting circuit according to claim 7.

12. A display device, comprising:
the gate driving circuit according to claim 11.

13. The level shifting unit according to claim 1, wherein the output module comprises a fifth transistor and a sixth transistor, the fifth transistor has the first switching characteristics, and the sixth transistor has the second switching characteristics;
a first electrode of the fifth transistor is connected to the signal output terminal and a first electrode of the sixth transistor, a second electrode of the fifth transistor is connected to the output control module, and a control electrode of the fifth transistor is connected to the logic control module; and
the first electrode of the sixth transistor is connected to the signal output terminal, a second electrode of the sixth transistor is connected to the output control module, and a control electrode of the sixth transistor is connected to the logic control module.

14. The level shifting unit according to claim 1, wherein the output control module comprises a seventh transistor and an eighth transistor, the seventh transistor has the first switching characteristics, and the eighth transistor has the second switching characteristics, wherein
a second electrode of the seventh transistor is connected to a high level signal terminal of the driving power supply, and a control terminal of the seventh transistor is connected to the feedback module; and
a second electrode of the eighth transistor is connected to a low level signal terminal of the driving power supply, and a control terminal of the eighth transistor is connected to the feedback module.

15. The level shifting unit according to claim 2, wherein the output control module comprises a seventh transistor and an eighth transistor, the seventh transistor has the first switching characteristics, and the eighth transistor has the second switching characteristics, wherein
a second electrode of the seventh transistor is connected to a high level signal terminal of the driving power supply, and a control terminal of the seventh transistor is connected to the feedback module; and a second electrode of the eighth transistor is connected to a low level signal terminal of the driving power supply, and a control terminal of the eighth transistor is connected to the feedback module.

16. The level shifting unit according to claim 1, wherein the feedback module comprises a voltage comparator, an OR gate and a second inverter; a first input terminal of the voltage comparator is connected to a first reference voltage terminal, a second input terminal of the voltage comparator is connected to a second reference voltage terminal, a third input terminal of the voltage comparator is connected to the signal output terminal, and an output terminal of the voltage comparator is electrically connected to a first input terminal of the OR gate;

a second input terminal of the OR gate is connected to the enable signal terminal, and an output terminal of the OR gate is connected to an input terminal of the second inverter; and the input terminal of the second inverter is connected to the output control module, and an output terminal of the second inverter is connected to the output control module.

17. The level shifting unit according to claim 2, wherein the feedback module comprises a voltage comparator, an OR gate and a second inverter;

a first input terminal of the voltage comparator is connected to a first reference voltage terminal, a second input terminal of the voltage comparator is connected to a second reference voltage terminal, a third input terminal of the voltage comparator is connected to the signal output terminal, and an output terminal of the voltage comparator is electrically connected to a first input terminal of the OR gate;

a second input terminal of the OR gate is connected to the enable signal terminal, and an output terminal of the OR gate is connected to an input terminal of the second inverter; and the input terminal of the second inverter is connected to the output control module, and an output terminal of the second inverter is connected to the output control module.

18. The level shifting unit according to claim 3, wherein the feedback module comprises a voltage comparator, an OR gate and a second inverter;

a first input terminal of the voltage comparator is connected to a first reference voltage terminal, a second input terminal of the voltage comparator is connected to a second reference voltage terminal, a third input terminal of the voltage comparator is connected to the signal output terminal, and an output terminal of the voltage comparator is electrically connected to a first input terminal of the OR gate;

a second input terminal of the OR gate is connected to the enable signal terminal, and an output terminal of the OR gate is connected to an input terminal of the second inverter; and the input terminal of the second inverter is connected to the output control module, and an output terminal of the second inverter is connected to the output control module.

19. The level shifting unit according to claim 1, further comprising: an enable signal generating module configured to output a high level signal at a power-on time, and input the high level signal into the feedback module through the enable signal terminal, wherein the feedback module outputs a feedback signal, to control the output control module to be turned on.

* * * * *